(12) United States Patent
Tailhades et al.

(10) Patent No.: US 9,376,346 B2
(45) Date of Patent: Jun. 28, 2016

(54) USE OF A COMBINATION OF IRON MONOXIDE AND SPINEL OXIDES AS A SENSITIVE MATERIAL FOR DETECTING INFRARED RADIATION

(75) Inventors: Philippe Tailhades, Saint Orens (FR); Lionel Presmanes, Castanet-Tolosan (FR); Corinne Bonningue, Toulouse (FR); Bruno Mauvernay, Toulouse (FR); Jean-Louis Ouvrier-Buffet, Sevrier (FR); Agnes Arnaud, Saint Jean le Vieux (FR); Wilfried Rabaud, Moirans (FR)

(73) Assignees: COMMISSARIAT A L'ENERGIE ATOMIQUE, Paris (FR); UNIVERSITE PAUL SABATIER (TOULOUSE III), Toulouse (FR); CENTRE NATIONAL DE LA RECHERCHE SCIENTIFIQUE, Paris (FR)

( * ) Notice: Subject to any disclaimer, the term of this patent is extended or adjusted under 35 U.S.C. 154(b) by 441 days.

(21) Appl. No.: 12/482,775

(22) Filed: Jun. 11, 2009

(65) Prior Publication Data
US 2010/0065743 A1 Mar. 18, 2010

Related U.S. Application Data

(63) Continuation-in-part of application No. PCT/FR2007/052511, filed on Dec. 14, 2007.

(30) Foreign Application Priority Data

Dec. 14, 2006 (FR) ..................................... 06 55502

(51) Int. Cl.
*G01J 5/02* (2006.01)
*C04B 35/01* (2006.01)
(Continued)

(52) U.S. Cl.
CPC ............. *C04B 35/01* (2013.01); *C04B 35/2658* (2013.01); *C04B 35/6263* (2013.01);
(Continued)

(58) Field of Classification Search
USPC ........................................................ 250/338.1
See application file for complete search history.

(56) References Cited

U.S. PATENT DOCUMENTS

| 2,616,859 | A | * | 11/1952 | Verwey .................... 252/519.51 |
| 5,821,598 | A | | 10/1998 | Butler et al. |
| 2007/0120059 | A1 | | 5/2007 | Tailhades et al. |

FOREIGN PATENT DOCUMENTS

| EP | 1 336 994 A1 | 8/2003 |
| FR | 2 864 065 | 6/2005 |

(Continued)

OTHER PUBLICATIONS

Verwey et al. Semi-conductors with large negative temperature coefficient of resistance, Philips Technical Review, vol. 9, No. 8 (1947), pp. 239-248.*

(Continued)

*Primary Examiner* — David Porta
*Assistant Examiner* — Shun Lee
(74) *Attorney, Agent, or Firm* — Oliff PLC

(57) ABSTRACT

The invention relates to the use of a material having a spinel ferrite/iron monoxide structure as a sensitive material in the form of a thin film for the bolometric detection of infrared radiation, the chemical composition of said structure, excluding doping agents that may be present, having empirical formula (I): $(Fe_{1-z}M_z)_xO$, where x is strictly less than 1 and strictly greater than 0.75. The invention also relates to a bolometric device for infrared radiation detection and infrared imaging, comprising at least one sensor provided with a sensitive element in the form of a thin film as defined above.

24 Claims, 2 Drawing Sheets

Figure 1:
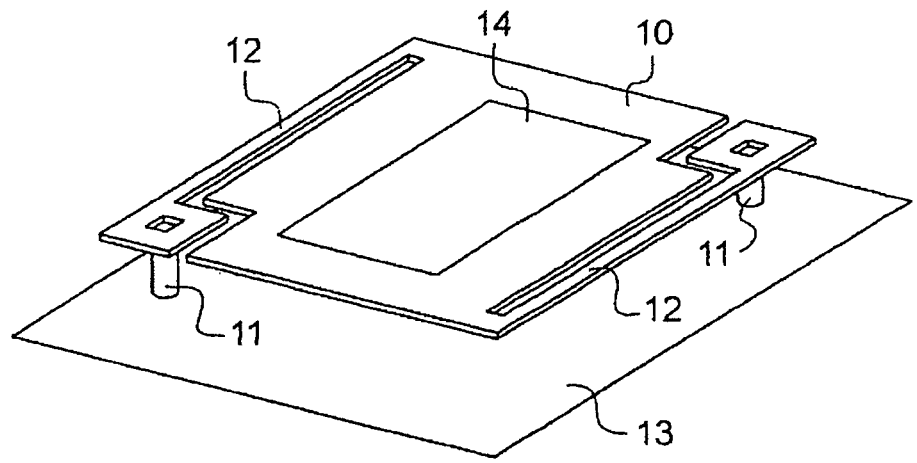

(51) Int. Cl.

| | |
|---|---|
| C04B 35/26 | (2006.01) |
| C04B 35/626 | (2006.01) |
| C04B 35/634 | (2006.01) |
| C23C 16/40 | (2006.01) |
| G01J 5/04 | (2006.01) |
| G01J 5/20 | (2006.01) |
| H01L 27/146 | (2006.01) |
| H01L 27/148 | (2006.01) |
| H01L 31/09 | (2006.01) |

(52) U.S. Cl.
CPC ......... *C04B35/63416* (2013.01); *C23C 16/406* (2013.01); *G01J 5/04* (2013.01); *G01J 5/046* (2013.01); *G01J 5/20* (2013.01); *H01L 27/14669* (2013.01); *H01L 27/14875* (2013.01); *H01L 31/09* (2013.01); *C04B 2235/3272* (2013.01); *C04B 2235/3284* (2013.01); *C04B 2235/449* (2013.01); *C04B 2235/604* (2013.01); *C04B 2235/608* (2013.01); *C04B 2235/658* (2013.01); *C04B 2235/76* (2013.01); *C04B 2235/80* (2013.01)

(56) References Cited

FOREIGN PATENT DOCUMENTS

| WO | WO 2005/043624 A1 | 5/2005 |
|---|---|---|
| WO | WO 2005/064294 A1 | 7/2005 |

OTHER PUBLICATIONS

Doctor et al.; "Sputtered File Thermistor IR Detectors;" *Proc IEEE Mohawk Valley Dual Use Technology and Applied Conference*; 1993; pp. 153-157.

Catlow et al.; "Calculations of defect clustering in $Fe_{1-x}O$;" *Journal of Physical Chemistry: Solid State Physics*; 1975; pp. 3267-3279; vol. 8; Great Britain.

Koch et al.; "The Defect Structure of $Fe_{1-x}O$;" *Acta Cryst.*; 1969; pp. 275-287; Section B25.

Dimitrov et al.; "Ferrimagnetism and defect clusters in $Fe_{1-x}O$ films;" *Physical Review B*; 1999; pp. 14 499-14-504; vol. 59, No. 22.

Baliga et al.; "Sputtered film thermistor IR detectors;" *SPIE*; 1994; pp. 72-78; vol. 2225.

Wriedt; "The Fe—O (Iron Oxygen) System;" *Journal of Phase Equilibria*; 1991; pp. 170-200; vol. 12, No. 2.

Wendel; "Adherence of Vitreous Enamel on Cast Iron—A Never Ending Story;" *20th International Enamellers' Congress*; 2005; Istanbul, Turkey.

Darken et al.; "The System Iron—Oxygen. II. Equilibrium and Thermodynamics of Liquid Oxide and Other Phases;" *Journal of American Chemical Society*; May 1946; pp. 798-816; vol. 68; No. 5.

* cited by examiner

Electrical properties as a function of the annealing temperature

USE OF A COMBINATION OF IRON MONOXIDE AND SPINEL OXIDES AS A SENSITIVE MATERIAL FOR DETECTING INFRARED RADIATION

The present invention relates to the use of thin films based on iron monoxides and on spinel oxides as a sensitive material for detecting infrared radiation.

Thermal infrared-detecting devices, such as bolometric detectors, are capable of absorbing incident infrared radiation and of converting it to heat. They generally comprise a sensitive element based on a material whose electrical resistance varies with temperature. The temperature variation of the sensitive element generates a variation in the resistance of said sensitive element. These devices therefore make it possible, using an appropriate electrical assembly, which is known per se, to convert a change in the temperature to an electrical signal.

For infrared imaging, use is currently made, as infrared cameras, of, inter alia, microbolometers comprising a plurality of microsensors arranged in the form of a matrix array of pixels. Each microsensor absorbs the infrared radiation which hits it, and the resulting temperature variations of the sensitive material, which is present in the form of a thin film in each microsensor, lead to a variation in the electrical resistance of said sensitive material. A measurement system, which is known per se, evaluates the variations in the resistance and translates them into electrical signals. These electrical signals can be converted into images using an appropriate imaging device, which is known per se.

Other infrared detection and imaging systems that have a good sensitivity are known, which use sensitive materials based on "HgCdTe" or "YBaCuO". However, these systems have the drawback of having to be cooled to the temperature of liquid nitrogen.

There are also "uncooled" bolometric devices, the operation of which is in particular based on the variations in the electrical properties of amorphous silicon or of vanadium oxide $VO_2$ or of pure spinel oxides. These devices are however less sensitive than the cooled devices.

Materials based on perovskites have also been recommended. They have a sensitivity that is potentially advantageous, but which is counterbalanced by an intense electronic noise.

The use of spinel-structured oxides based on nickel, manganese and cobalt for producing bolometers has also been described in the article by A. Doctor et al. "Sputtered films thermistor IR detector", Proc. IEEE Mohawk Valley Dual Use Technology and Applied Conference, 153-156, 1993.

As for document PCT/FR2004/0506695, it describes bolometers that use a spinel ferrite material that has vacancies (is non-stoichiometric) as a material sensitive to the detection of infrared radiation.

The present invention results more particularly from the discovery by the inventors that the combinations, in the form of thin films, of iron monoxide with a spinel oxide also prove particularly effective as sensitive materials for bolometric infrared-detecting devices.

Thus, according to one of its aspects, the invention relates to the use, as a thin-film sensitive material for the bolometric detection of infrared radiation, of at least one combination of iron monoxide and of spinel ferrite(s), the chemical composition of which, excluding dopants that may be present, corresponds to the empirical formula:

$$(Fe_{1-z}M_z)_xO \qquad (I)$$

in which:
the metals or the oxygen are in the form of ions;
Fe represents identical or different ferrous and/or ferric cations;
M represents metal cations, other than the ferrous cations;
z represents the number of metal cations other than the ferrous cations;
x is a number strictly less than 1 and strictly greater than 0.75.

Within the meaning of the present invention, the expressions "strictly greater than" or "strictly less than" exclude the limiting value specified.

According to one embodiment, z may take values such that: $0 \leq z < 1$.

According to a first variant, the material in question according to the invention is single-phase, has an NaCl-type structure and corresponds to the structural formula:

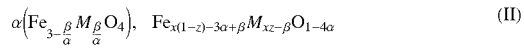 (II)

in which:

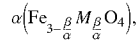

represents "spinel aggregates"; and
$Fe_{x(1-z)-3\alpha+\beta}M_{xz-\beta}O_{1-4\alpha}$ represents the NaCl-type iron monoxide matrix in which the spinel aggregates are dispersed, with:
β representing the number of M cations, other than the ferrous cations, within the "spinel aggregates";
α representing the number of

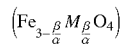

formula units contained in the assembly of the "spinel aggregates"; and
M, Fe and O being as defined above.

Within the meaning of the present invention, the expression "single-phase material" is understood to mean a material for which the X-ray or electron diffraction pattern reveals only one system of lines, of points or of rings that can be attributed to a material of NaCl-type crystallographic structure.

According to a second variant, the material in question according to the invention is two-phase, comprises a spinel oxide phase and an NaCl-type iron monoxide phase and may be defined as follows:

$$\omega Fe_{3-y}M_yO_4 + (1-\omega)(Fe_{1-v}M_v)_sO \qquad (III)$$

where:
$(Fe_{1-v}M_v)_sO$ represents an NaCl-type iron monoxide phase; and
$Fe_{3-y}M_yO_4$ represents a spinel oxide phase,
with:
M, Fe and O being as defined above;
v representing the number of M cations, other than the ferrous ions, present within the iron monoxide phase;
y representing the number of M cations, other than the ferrous ions, present within the spinel phase;
s being a number strictly less than 1 and strictly greater than 0.75; and ω being a number that satisfies the relationship 0<ω<1.

Within the meaning of the present invention, the expression "two-phase material" is understood to mean a material for which the X-ray or electron diffraction pattern reveals two systems of lines, of points or of rings, one being characteristic of the spinel-type material, the other being characteristic of the NaCl-type material.

The present invention also relates, according to another of its aspects, to a bolometric device for detecting infrared radiation or for infrared imaging, comprising at least one sensor provided with a sensitive element having the form of a thin film of a single-phase material having an NaCl-type structure or of a two-phase material comprising a spinel oxide phase and an NaCl-type oxide phase according to the present invention.

It also relates, according to another of its aspects, to a method of detecting infrared radiation or of producing infrared imaging, using a bolometric device capable of absorbing incident radiation, of converting it to heat, and of communicating a portion of the heat produced to a sensitive element whose resistivity varies with the temperature, in which said device is as defined hereinbelow.

DESCRIPTION OF THE INVENTION

Firstly, it will be recalled hereinbelow that iron monoxide (or protoxide of iron) is most of the time non-stoichiometric due to a deficit of cations and is written in the form $Fe_{1-z}O$. These solid solutions of oxygen in FeO are often known under the name of "wustite". The balancing of the electrostatic charges within $Fe_{1-z}O$ involves the formation of ferric ($Fe^{3+}$) ions by oxidation of a small proportion of ferrous ions. However, the ferrous ions constitute the majority of the iron monoxide cations.

The formation of ferric ions is the cause of structural defects, described in detail by C. R. A. Catlow and B. E. F. Fender (J. Phys. C8, 3267, (1975)) on the one hand, and F. Koch and J. B. Cohen (Acta Cryst., section B, 25, 275, (1969)) on the other hand. These defects tend to cluster together and form aggregates which may locally induce the partial or complete construction of $Fe_3O_4$ spinel-type lattices, when they attain a large size and a sufficient degree of organization.

It is thus possible to describe the $Fe_{1-z}O$ oxides by formulae of the type:

$$\alpha(Fe^{2+}Fe_2^{3+}O_4^{2-}),(1-4\alpha)(Fe^{2+}O^{2-})$$

namely:

$$\alpha(Fe_3O_4),(1-4\alpha)(FeO)$$

when the divalent and trivalent cations are not differentiated.

The expressions $\alpha(Fe^{2+}Fe_2^{3+}O_4^{2-})$ and $\alpha(Fe_3O_4)$ written in the preceding formulae thus refer to spinel-type aggregates. As regards the second parts of the preceding formulae, they represent a perfectly stoichiometric iron monoxide.

Similarly, when iron monoxide is substituted by divalent cations, the simplified empirical formula $(Fe_{1-z}M_z)_xO$ can be expanded as indicated below:

$$\alpha\left(Fe_{3-\frac{\beta}{\alpha}}M_{\frac{\beta}{\alpha}}O_4\right), \quad Fe_{x(1-z)-3\alpha+\beta}M_{xz-\beta}O_{1-4\alpha} \tag{II}$$

when the divalent and trivalent cations are not differentiated.

Unexpectedly, the inventors therefore observed that the use of a combination of iron monoxide and of spinel ferrite(s) in accordance of the empirical formula (I) as a sensitive material for bolometric infrared-detecting devices proves particularly advantageous for obtaining a material that has a moderate electrical resistivity, combined with weak low-sequence noise that is very temperature sensitive.

When x equal 1, then the empirical formula (I) corresponds to FeO which is an insulating material devoid of $Fe^{2+}/Fe^{3+}$ and which therefore cannot be used as a sensitive material for detecting infrared radiation in bolometric devices.

By selectively choosing a value for x in the range 0.75<x<1, the inventors have succeeded to provide a material endowed with an increased coercitive force Hc resulting from the magnetic coupling between the anti-ferromagnetic phase $Fe_{1-x}O$ and the ferromagnetic phase $Fe_3O_4$. Such material, in contrast to pure $Fe_3O_4$, results in improving infrared detection.

A combination of this type makes it possible to carry out electrical measurements at a high signal-to noise ratio, and its sensitivity may be exploited for detecting infrared radiation of low intensity, especially in the band of wavelengths from 8 to 12 micrometers.

As specified previously, the material combining NaCl-type iron monoxide with a spinel ferrite and that can be represented by the empirical formula (I) may be single-phase or two-phase.

In fact, this specificity is directly linked to the size and/or degree of organization of the spinel ferrite aggregates within the NaCl-type monoxide phase.

Thus, when the spinel structure is present within the material only in the form of aggregate(s) or else cluster(s) dispersed in the NaCl monoxide structure, only the NaCl phase proves able to be characterized by X-ray or electron diffraction. Such a material is qualified as being of NaCl type according to the invention.

On the other hand, above a certain size and/or degree of organization of the spinel aggregates, in particular illustrated by a combination of nanoscale grains of a spinel phase and of an NaCl phase, the two phases prove able to be characterized by X-ray or electron diffraction. It should be noted that in this second embodiment variant, represented by the general formula (III), the NaCl phase may, starting from too high a spinel phase presence, be difficult to characterize, even though it is present. However, the Mossbauer spectroscopy more particularly proposed for carrying out this phase characterization makes it possible, in such a case in point, to discern the two phases. Such a material is qualified as being of NaCl and spinel ferrite type according to the invention.

Furthermore, it should be noted that a material that has only a spinel phase is outside the field of the invention insofar as "x" from formula (I) remains strictly greater than 0.75.

In the case of a single-phase material that has an NaCl-type crystallographic structure and corresponds to the structural formula:

$$\alpha\left(Fe_{3-\frac{\beta}{\alpha}}M_{\frac{\beta}{\alpha}}O_4\right), \quad Fe_{x(1-z)-3\alpha+\beta}M_{xz-\beta}O_{1-4\alpha} \tag{II}$$

z preferably satisfies the convention 1−z>z, that is to say z<0.5 and more preferably still the convention 1−z>2z, that is to say z<0.33.

Still in this case, according to one particular embodiment of the invention, x fulfills the condition 0.85≤x<1, preferably 0.85≤x≤0.95 and more preferably still 0.85≤x≤0.90.

In the case of a two-phase material having an NaCl-type iron monoxide phase and a spinel oxide phase and corresponding to the formula (III):

$$\omega Fe_{3-y}M_yO_4 + (1-\omega)(Fe_{1-v}M_v)_sO \quad (III)$$

v preferably satisfies the convention 1−v>v, that is to say v<0.5 and more preferably still 1−v>2v, that is to say v<0.33.

Still in this case, according to one particular embodiment of the invention, it is recalled that s fulfills the condition 0.75<s<1.

In the above formulae Fe represents all of the iron cations (ferrous and ferric cations).

In this same formula, M represents a metal other than iron or a combination of two or more metals other than iron.

In other words, M may be symbolized in the general formula I by the sequence $M_{x_0}M'_{x_1}M''_{x_2}$ in which M, M', M", etc. represent metals other than iron and the subscripts $x_0$, $x_1$ and $x_2$ represent the number of M, M', M", etc. ions.

In particular, M may be a monovalent metal cation chosen from Cu, Li, Na or a divalent metal cation chosen from Co, Ni, Zn, Cu, V, Mg, Mn or a metal cation chosen from the rare earths that have an ionic radius compatible with an integration into the spinel oxide structure or into the NaCl-type iron monoxide structure.

The materials in question according to the invention may of course also contain iron oxides and/or mixed oxides other than the spinel ferrites and NaCl-type monoxides on condition that their empirical formulae remain in accordance with the empirical formula (I). Thus, the materials may comprise, for example, $Fe_2O_3$, of x or γ type, the material will then be three-phase.

According to one embodiment, a material of the invention may also comprise an iron sesquioxide, in particular $\alpha$-$Fe_2O_3$.

Similarly, the compositions of the iron monoxide or spinel phase, or else of the monoxide and spinel oxide phases in the case of a two-phase material, may be modified by dopants, which are not represented by the formulae (I) to (III) and which are not necessarily part of the crystal lattice. The use of a large number of dopants has been described for this type of compound. The presence of dopants may, for example, facilitate the regulation of the crystallization. Generally, the dopants are present in the form of oxides in a weight proportion that does not exceed 1 to 2% by weight, relative to the weight of the spinel oxide. The dopants are, for example, silicon, phosphorus, boron, alkaline-earth metals (in particular Ca, Ba, Sr), alkali metals (for example Na, K), gallium, germanium, arsenic, indium, antimony, bismuth, lead, etc.

Finally, the materials used according to the invention may be amorphous or crystalline, and in particular they will preferably be in the form of thin films composed of crystallites having a diameter between 5 and 50 nm and preferably between 10 and 30 nm.

A thin film of the sensitive material according to the invention can be obtained on an appropriate substrate by the usual techniques, in particular by sputtering, starting with a target obtained in a conventional manner by sintering a mixture of powders of the oxides of the various metals chosen, possibly together with dopants (the latter possibly being in the form of oxides).

The film may also be obtained by sputtering a metal target or an oxide-metal cermet with an oxygen-containing plasma.

It should be noted that the aggregates of spinel type are not generally stabilized in the $Fe_{1-z}O$ powders obtained by quenching from high temperatures (at least above 600° C.). This is because the thermal energy is sufficient in this case to destroy the largest and most complex defect aggregates.

Conversely, according to D. V. Dimitrov et al. (Phys. Rev. B, Vol. 59, No. 22, 14 499-14 504, (1999)), the same is not true in the $Fe_{1-z}O$ oxides obtained in the form of thin films on cooled substrates. In these thin films, the defects are advantageously aggregated so as to locally create spinel lattices and are the cause of behavior of ferrimagnetic and superparamagnetic type respectively at low (<200 K) and "high" (>200 K) temperature. The defects in the thin films thus tend to approach the $Fe_{1-z}O$ properties of those of spinel ferrite films.

It is furthermore known that the $Fe_{1-z}O$ oxides in the "bulk" state are semiconductors having a conductivity that can reach several tens of Siemens per centimeter (S/cm). The mixed valence states of the iron are the reason for these electrical properties.

The development of "spinel aggregates" due to an increase in oxidation state of the whole of the thin film tends to create a two-phase system comprising an NaCl-type monoxide and a spinel-type oxide. These two-phase films may also exhibit semiconductor properties, due in particular to the electronic conduction by electron hopping in the two phases present.

As regards the sputtering technique capable of being used to obtain a thin film of the sensitive material according to the invention on an appropriate substrate, this is a process of depositing thin films of any material onto a substrate in a chamber containing an inert gas, generally argon kept at a reduced pressure. Under the influence of an electric field, the gas is ionized with formation of a light-emitting plasma, and the impact of the incident ions on the material, known as the "target material" or "target", which is fastened to an electrode that is subjected to a cathode potential, causes, via a mechanical effect, atoms to be expelled from the surface of the material, which atoms will be deposited on the substrate that is placed facing the target. In general, the composition of the deposition is close to the composition of the target material.

The use of AC voltages, in particular high-frequency AC voltages, presents various advantages, especially the sputtering of insulating materials and the possibility of using lower breakdown voltages than in direct current. One such process is called radio-frequency sputtering (or RF sputtering).

By superposing a magnetic field over the electric field in the vicinity of the cathode (use of a magnetron cathode), it is possible to complicate the trajectories of the electrons of the plasma and thus increase the ionization of the gas, which in particular makes it possible to obtain a higher deposition rate for one and the same applied power.

Whether the target is composed of single or mixed oxides, of a pure or alloyed metal or of an oxide-metal cermet, the oxidation state of the film deposited and therefore the nature of the oxide obtained depend on the processing conditions. The partial pressure of oxygen, controlled by the oxygen content of the target and/or by the addition of oxygen to the plasma, the chamber pressure, the polarization of the substrate, the use of a magnetron, the distance from the target to the substrate and also the sputtering power, are parameters that strongly influence the oxidation state and the nature of the thin films deposited.

The material in question according to the invention may advantageously be used in the form of an amorphous or polycrystalline single-phase or two-phase thin film, having a thickness ranging from 10 to 500 nm, and in particular from 50 to 150 nm, composed of crystallites, the average size of which varies between around 5 and 50 nm, and in particular between around 10 and 30 nm.

These dimensional characteristics, by virtue of the small thickness of the film, indeed make it possible to minimize the thermal inertia of the sensitive film and, by virtue of the small size of the crystallites, to minimize the dispersion of the electronic noise from one pixel to the next, during bolometric detection.

For example, by carrying out the deposition by radio-frequency sputtering of an $Fe_3O_4$ target, under an argon pressure which may range from 0.1 to 2.5 Pa, and onto a substrate that is negatively polarized by a voltage of −10 V, it is possible to obtain iron monoxide compositions that exhibit the features that have just been indicated.

During the deposition of mixtures of single or mixed oxides, which deposition is optionally followed by a heat treatment in an oxidizing atmosphere, the thin film may spontaneously adopt the crystalline structure of NaCl, if it is single-phase, or of NaCl and spinel type if it is two-phase.

The phases used according to the invention have semiconductor properties.

Specifically, their conductivity increases with temperature: these are products said to have a negative temperature coefficient. Such products are characterized by their activation energy, Ea, calculated according to the equation:

$$Ea^* = kB,$$

with k representing the Boltzmann constant and

B the energy constant, which corresponds to the slope of the curve representing log R as a function of 1/T with R denoting the electrical resistance and T the temperature.

In particular, the activation energy Ea may be calculated from two resistance measurements, R1 and R2, respectively made at temperatures T1 and T2:

$$Ea = k \frac{T_1 \cdot T_2}{T2 - T1} \log\left(\frac{R1}{R2}\right)$$

The sensitivity of a material for a bolometric detector is expressed using the temperature coefficient α, which represents the derivative of the resistance relative to the temperature, divided by the resistance:

$$\alpha = \frac{dR}{dT} \cdot \frac{1}{R} \cdot 100 = \frac{Ea}{k \cdot T^2} \cdot 100$$

The coefficient α is expressed in %.Kelvin$^{-1}$ (%.K$^{-1}$).

It is currently acknowledged that the electronic conduction in transition metal oxides takes place by virtue of the mixed valence states of the metal cations. The conduction occurs via a "hopping" transition mechanism. The electrical resistivity may thus be adjusted by modifying the number of pairs of cations at different valence states by subjecting an oxide to redox treatments.

After depositing the single-phase or two-phase thin film, it may be advantageous to carry out a heat treatment under an oxidizing atmosphere. The small thickness of the films deposited and also the small size of the crystallites facilitate an oxidation at a moderate temperature, generally less than or equal to 300° C. This oxidation treatment makes it possible to increase the proportion of ferric ions (increase in x) in oxides of $(Fe_{1-z}M_z)_xO$ type and to reduce the electrical resistivity of the film. It may also increase the variation of the resistivity with temperature, which represents the sensitivity property desired for the active materials of bolometric devices or contributes to relaxing the mechanical stresses optionally present after deposition. This treatment is however adjusted so as to avoid the complete oxidation of the monoxide phase and therefore its complete conversion to an oxide of spinel or corundum type.

It is within the scope of a person skilled in the art to determine, by simple routine experiments, the conditions of the oxidation treatment that optionally make it possible to obtain, for a given composition of metals, the degrees of oxidation that give an optimum value of the coefficient α, or a value of α greater, in absolute value, than a predetermined threshold value (for example >1%.K$^{-1}$).

In the same way, the person skilled in the art is able to select, with such routine experiments, compositions of transition metals that make it possible to obtain advantageous resistivity properties, or to optimize the relative proportions of the metals of such compositions.

In a research phase, the method for obtaining a sensitive film according to the invention therefore consists in depositing a film having a chemical composition close to $(Fe_{1-z}M_z)_xO$ and in carrying out, if necessary, oxidation treatments that optionally make it possible to improve the value of α, in order to select the compositions for which the absolute value of α is, for example, above 1%.K$^{-1}$ or above another desired value, while retaining a low resistivity and a low electronic noise. The thin film is generally deposited onto one or more films capable of ensuring the mechanical rigidity, the absorption of the infrared radiation and the electrical connections of the sensitive film. This thin film or the set of films may be deposited onto a sacrificial structure.

As specified previously, another aspect of the invention relates to a bolometric device for detecting infrared radiation or for infrared imaging, comprising at least one sensor provided with a sensitive element having the form of a thin film of material as defined previously.

In one particular embodiment of the bolometric device of the invention, the sensor, which is inserted into a housing comprising an infrared-transparent aperture area, comprises a membrane capable of absorbing infrared radiation and of converting it to heat, said membrane being arranged so as to be able to be exposed to incident infrared radiation that has passed through the aperture area, and so as to transmit a portion of the heat thus produced to said sensitive element. Represented in FIG. 1 is a simplified view of such a device.

The bolometric device which is represented therein comprises a thin membrane 10 that is capable of absorbing the infrared radiation, and that is suspended on top of a support 13 via anchoring points 11. A sensitive film 14 is deposited on the membrane 10. Under the effect of infrared radiation, the membrane heats up and transmits its temperature to the film 14. The electrical interconnection between the sensitive film 14 and the read elements (not represented) positioned on the substrate is provided by a generally metallic film, not represented, that passes through the anchoring points 11. The sensitivity of the thermal detection is notably improved by introducing insulating arms 12 between the support substrate and the membrane in order to limit the heat losses of the latter. The variations in resistivity of the sensitive film are recorded using two electrodes connected to an appropriate read circuit. The electrodes may be either coplanar, or facing (sandwich) electrodes.

In the bolometric devices according to the invention, the support substrate may be composed of an electronic circuit integrated into a silicon wafer comprising, on the one hand, devices for stimulating and reading the temperature variations and, on the other hand, the multiplexing components which make it possible to serialize the signals from the various thermometers and to transmit them to a reduced number of outputs in order to be exploited by a standard imaging system.

As regards the membrane on which the thin film of material according to the invention is deposited, it may be composed, for example, of one or more dielectric layer(s), in particular SiO or SiN dielectric layer(s).

In the case of a single layer, this layer may be partially covered by electrodes, in particular TiN electrodes, which have a strong absorption of infrared radiation. In the case of two layers, the electrodes may be either affixed to the surface of the outer layer or embedded between the two layers.

The thin film of material according to the invention is deposited on this membrane according to one of the techniques described previously.

FIG. 2 shows two variants for integrating a thin film of material according to the invention into a coplanar electrode detector.

Figure 2A:
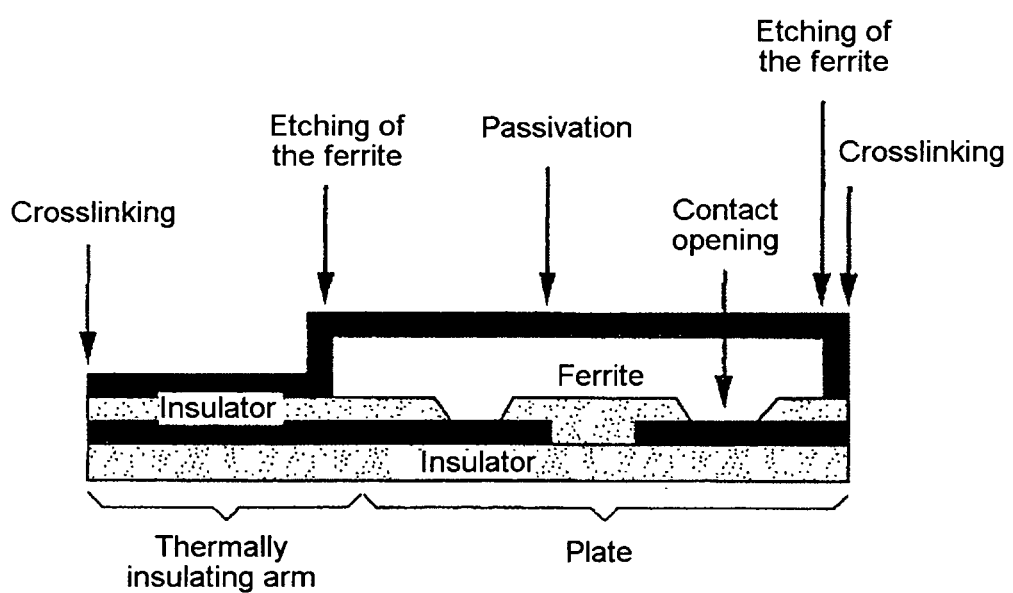

In FIG. 2A, the structure that supports a thin film of material according to the invention is composed of two insulating layers that enclose metal electrodes. The insulating layer deposited on the metallic layer comprises contact openings so as to connect the ferrite sensitive element.

Figure 2B:
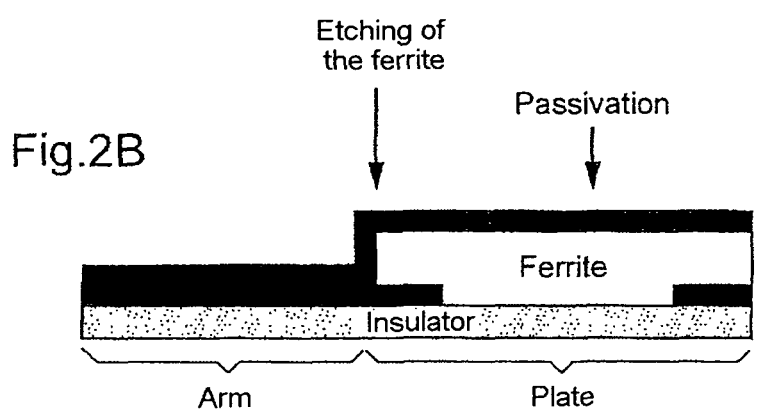

In FIG. 2B, the structure that supports a thin film of material according to the invention is composed of a single insulating layer on which metal electrodes lie that are directly in contact with the ferrite sensitive element. In this configuration, it may be advantageous to deposit a layer that absorbs infrared radiation on one of the faces of the structure.

In these two embodiment variants, the etching of a thin film of material according to the invention makes it possible to clear the material in the region of the insulating arms and in the regions that separate the detectors from one another.

These two embodiments advantageously result in a component that is optimized in terms of signal-to-noise ratio.

It is understood that the bolometric devices conforming to the invention may comprise a plurality of sensors in the form of a matrix array of pixels. Such an array of sensors may be connected, for example, to a CCD or CMOS matrix. With an appropriate imaging system, the device of the invention then constitutes an infrared camera.

The bolometric devices of the invention may also be integrated into structures known as monolithic structures, collectively manufactured by the microelectronics processes that have been developed for silicon.

Thus, monolithic infrared imagers, which operate at ambient temperature, may be manufactured by directly connecting a matrix of sensitive elements to a multiplexing circuit of CMOS or CCD type. The support substrate may be composed of an integrated electronic circuit comprising, on the one hand, stimulation and read devices and, on the other hand, the multiplexing components which make it possible to serialize the signals from the various detectors and to transmit them to a reduced number of outputs in order to be exploited by a standard imaging system.

In such devices, the insulating supports are produced in the form of thin films that have, for example, a thickness of 5 to 100 nm. These insulating elements (for example SiN, SiO, ZnS, etc.) are obtained using the low-temperature deposition techniques customarily used for these materials, such as sputtering or plasma-enhanced chemical vapor deposition (PECVD). The etching of these materials is generally carried out by plasma-enhanced chemical etching processes.

The metallic materials constituting the electrodes (for example Ti, TiN, Pt, etc.) are preferably deposited by sputtering. The shape of the electrodes is defined by chemical or plasma etching processes. The thickness of the electrodes is, for example, between 5 nm and 100 nm. The electrodes that extend into the insulating arms are connected to the input stage of the read circuit by conventional contact-making processes, and are adapted to the structure of the microbridge (analogous to the anchoring points 11 from FIG. 1).

The material is deposited in the guise of a thin film according to the invention, using one of the techniques described previously. It may be etched by chemical means (HCl, $H_3PO_4$) or by specific plasma etching processes, or else by ion machining.

The invention also relates to a method of detecting infrared radiation or of producing infrared imaging, using a bolometric device capable of absorbing incident radiation, of converting it to heat, and of communicating a portion of the heat produced to a sensitive element whose resistivity varies with the temperature, in which said device is as defined previously.

The device of the invention can be used in numerous fields of application, for example in the military field (night scanning and sighting devices), in the industrial field (inspection of parts), in the safety field (detection of fires, locating victims in smoke-filled rooms, night-time surveillance of sites, assistance in driving vehicles at night), or in the medical field (mapping of blood circulation, mammography, etc.).

Figure 3:
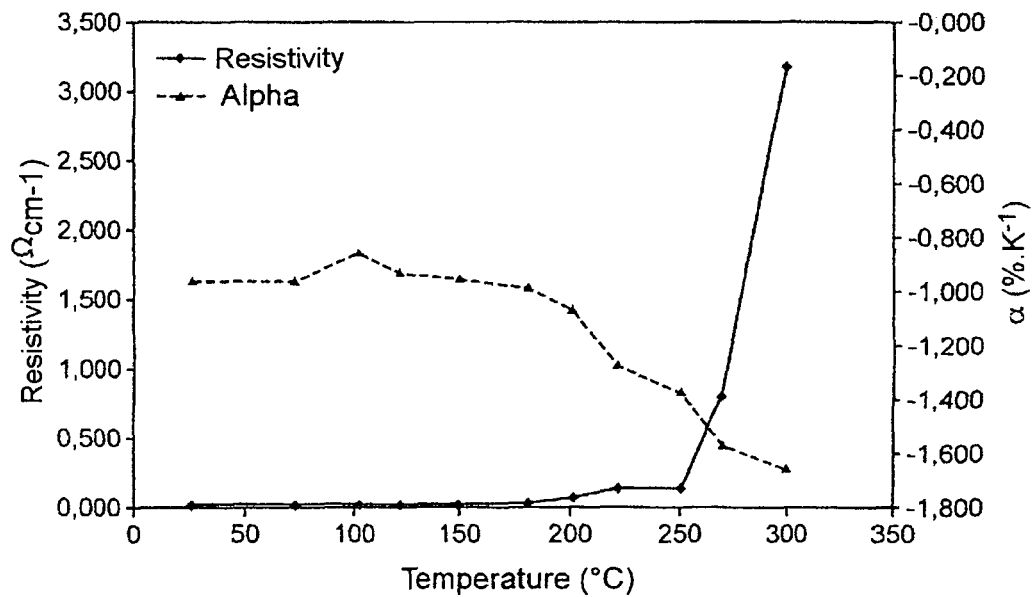

The following examples and figures are presented by way of illustration and non-limitingly with respect to the field of the invention:

FIG. 1 schematically represents a simplified perspective view of an embodiment of a bolometric device according to the invention;

FIGS. 2A and 2B illustrate two variants of integrating a thin film of the material according to the invention into a bolometric device according to the invention, and FIG. 3 represents the change in the electrical properties of the material according to example 3 as a function of the annealing temperature.

EXAMPLE 1

Thin Film Based on a Single-Phase Material According to the Invention

A magnetite target was prepared from a mixture comprising 48% (by mass) of magnetite, 48% water and 4% of an organic binder (polyvinyl alcohol). This mixture was then ground so as to obtain grains of less than 200 µm. Next, the powder was pressed under 55 tonnes in a 10 cm mold using a hydraulic press. Next, the ceramic obtained was debound then densified by sintering at 860° C. under an argon atmosphere to avoid the formation of the $\alpha$-$Fe_2O_3$ oxide. A ceramic target of magnetite densified to 65% was then obtained.

The thin film was produced with an SCM400 type (Alcatel CIT) sputtering unit, operating in radio-frequency mode. The thin films were deposited on a standard substrate having a thickness of 1.2 mm.

The deposition conditions were the following:
argon plasma;
chamber pressure: 0.5 Pa;
target-substrate distance: 80 mm;
RF power density: 0.75 W/$cm^2$;
bias (negative polarization of the substrate): 30 W
deposition with magnetron;
deposition rate: 3.5 nm/min.

Radiocrystallographic analysis showed that the thin films were composed of an NaCl-type iron monoxide phase. The electrical properties of the films in the raw deposition state were the following:

|  | Example 1 |
| --- | --- |
| Thickness (nm) | 100 |
| Resistivity (Ohm · cm) | 0.20 |
| Alpha (% · K$^{-1}$) | −1.43 |

EXAMPLE 2

Thin Films Based on a Two-Phase Material According to the Invention

Starting from a thin film produced under conditions identical to example 1, and by a suitable heat treatment in air, a portion of the FeO was oxidized to $Fe_3O_4$. Therefore, the ratio of the $Fe^{2+}/Fe^{3+}$ pair increased and consequently the resistivity of the thin film decreased.

Radiocrystallographic analysis showed that the thin films were composed of an NaCl-type iron monoxide phase and of an $Fe_3O_4$ spinel phase.

The electrical properties of the films were the following:

|  | Example 2a | Example 2b |
| --- | --- | --- |
| Treatment | 150° C. | 200° C. |
| Resistivity (Ohm · cm) | 0.13 | 0.06 |
| Alpha (% · K$^{-1}$) | −1.25 | −1.01 |

EXAMPLE 3

Thin Films Based on a Two-Phase Material According to the Invention

Thin films of magnetite $Fe_3O_4$ and FeO were prepared with the method described in example 1 and using the same target. The substrates were identical, but the deposition conditions were different, being the following:
  argon plasma;
  chamber pressure: 0.5 Pa;
  target-substrate distance: 80 mm;
  RF power density: 0.75 W/cm$^2$;
  bias (negative polarization of the substrate): 10 W;
  deposition with magnetron;
  deposition rate: 4.25 nm/min;
  thickness of the deposition: 100 nm.

Radiocrystallographic analysis showed that the thin films were composed of an NaCl-type iron monoxide phase and of an $Fe_3O_4$ spinel oxide phase.

The electrical properties were modified by heat treatments in air (treatment time: 2 hours) enabling an oxidation of the NaCl-type iron monoxide to $Fe_3O_4$ spinel. The results are presented in FIG. 3A, and show that such oxidation treatments make it possible to improve the sensitivity α.

EXAMPLE 4

Thin Films Based on a Single-Phase Material According to the Invention

The required amounts of oxides (0.95 mol of NiO, 1.025 mol of $Fe_2O_3$) were mixed and finely ground. The powder was chamotte-fired at 700° C. The process for obtaining the sintered target was analogous to example 1. The sintering temperature was 1300° C. in air.

The thin films were deposited on a glass substrate having a thickness of 1.2 mm. The deposition conditions were the following:
  argon plasma;
  chamber pressure: 0.5 Pa;
  target-substrate distance: 55 mm;
  RF power density: 3 W/cm$^2$;
  bias (negative polarization of the substrate): 10 W;
  deposition without magnetron;
  deposition rate: 3.7 nm/min;
  thickness of the deposition: 100 nm.

Radiocrystallographic analysis showed that these thin films were composed of a single NaCl-type phase.

The electrical properties of the film in the raw deposition state were the following:
  Resistivity=3.30 Ohm·cm;
  Alpha=−2.21%.K$^{-1}$

EXAMPLE 5

Thin Films Based on a Single-Phase Material According to the Invention

A ferrite powder was obtained by co-precipitation of oxalates from zinc and iron sulfates precipitated in ammonium oxalate. The oxalate was then decomposed at 700° C. in air so as to obtain a mixture composed of $ZnFe_2O_4$ and of alpha-$Fe_2O_3$. The process for obtaining the sintered target was analogous to example 1. The sintering was carried out at a temperature of 990° C. under nitrogen.

The thin films were deposited on a glass substrate having a thickness of 1.2 mm. The deposition conditions were the following:
  argon plasma;
  chamber pressure: 0.5 Pa;
  target-substrate distance: 50 mm;
  RF power density: 3 W/cm$^2$;
  bias (negative polarization of the substrate): 0 W to 10 W;
  deposition without magnetron;
  thickness of the deposition: 100 nm.

Radiocrystallographic analysis showed that these thin films were composed of a single NaCl-type phase.

The electrical properties of the films were the following:

|  | Example 5b | Example 5c |
| --- | --- | --- |
| Bias (W) | 5 | 10 |
| R (Ohm · cm) | 0.70 | 0.50 |
| α = ΔR/(R · ΔT) (% · K$^{-1}$) | −1.6 | −1.5 |

The invention claimed is:

1. A bolometric device for detecting infrared radiation or for infrared imaging, comprising at least one sensor provided with a sensitive element having the form of a thin film comprising at least one combination of iron monoxide and of spinel ferrite(s), the chemical composition of which, excluding dopants that may be present, corresponds to the empirical formula:

$$(Fe_{1-z}M_z)_xO \quad (I)$$ 

wherein:
  the metals or the oxygen are in the form of ions;
  Fe represents identical or different ferrous and/or ferric cations;
  M represents metal cations, other than the ferrous cations;
  z represents the number of metal cations other than the ferrous cations;

x being a number less than 1 and greater than 0.75; wherein the thin film is a single-phase material having an NaCl-type structure comprising the at least one combination of iron monoxide and of spinel ferrite(s).

2. The bolometric device as claimed in claim 1, wherein the thin film has a thickness ranging from 10 to 500 nm.

3. The bolometric device as claimed in claim 1, wherein the at least one sensor, inserted into a housing comprising an infrared-transparent aperture area, comprises a membrane capable of absorbing infrared radiation and of converting it to heat, the membrane being arranged so as to be able to be exposed to incident infrared radiation that has passed through the aperture area, and so as to transmit a portion of the heat thus produced to the sensitive element.

4. The bolometric device as claimed in claim 1, comprising a plurality of the at least one sensor in the form of an array of pixels.

5. The bolometric device as claimed in claim 4, wherein the array is connected to a CCD or CMOS matrix.

6. The bolometric device as claimed in claim 1, wherein the thin film has the structural formula:

$$\alpha\left(\text{Fe}_{3-\frac{\beta}{\alpha}}M_{\frac{\beta}{\alpha}}O_4\right), \quad \text{Fe}_{x(1-z)-3\alpha+\beta}M_{xz-\beta}O_{1-4\alpha} \quad \text{(II)}$$

wherein:

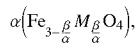

represents spinel aggregates; and
$\text{Fe}_{x(1-z)-3\alpha+\beta}M_{xz-\beta}O_{1-4\alpha}$, represents the NaCl-type iron monoxide matrix wherein the spinel aggregates are dispersed, with:
β representing the number of M cations, other than the ferrous cations, within the spinel aggregates;
α representing the number of

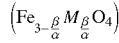

formula units contained in the assembly of the spinel aggregates;
the metals or the oxygen are in the form of ions;
Fe represents identical or different ferrous and/or ferric cations; and
M represents metal cations, other than the ferrous cations.

7. The bolometric device as claimed in claim 1, wherein the thin film comprises crystallites having a diameter ranging from 5 and 50 nm.

8. A method for providing a thin film sensitive material for the bolometric detection of infrared radiation, comprising providing the thin film recited in claim 1.

9. The method as claimed in claim 1, wherein the chemical composition of the thin film sensitive material corresponds to the structural formula:

$$\alpha\left(\text{Fe}_{3-\frac{\beta}{\alpha}}M_{\frac{\beta}{\alpha}}O_4\right), \quad \text{Fe}_{x(1-z)-3\alpha+\beta}M_{xz-\beta}O_{1-4\alpha} \quad \text{(II)}$$

wherein:

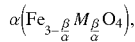

represents spinel aggregates; and
$\text{Fe}_{x(1-z)-3\alpha+\beta}M_{xz-\beta}O_{1-4\alpha}$, represents the NaCl-type iron monoxide matrix wherein the spinel aggregates are dispersed, with:
β representing the number of M cations, other than the ferrous cations, within the spinel aggregates;
α representing the number of

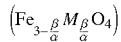

formula units contained in the assembly of the spinel aggregates;
the metals or the oxygen are in the form of ions;
Fe represents identical or different ferrous and/or ferric cations; and
M represents metal cations, other than the ferrous cations.

10. The method as claimed in claim 1, wherein z satisfies the convention 1−z>z.

11. The method as claimed in claim 1, wherein x fulfills the convention 0.85≤x<1.

12. A method of detecting infrared radiation or of producing infrared imaging, the method comprising:
absorbing incident radiation with a bolometric device capable of absorbing the incident radiation,
converting the absorbed incident radiation to heat, and
communicating a portion of the heat produced to a sensitive element whose resistivity varies with the temperature, wherein the bolometric device is as defined in claim 1.

13. A bolometric device for detecting infrared radiation or for infrared imaging, comprising at least one sensor provided with a sensitive element having the form of a thin film comprising at least one combination of iron monoxide and of spinel ferrite(s), the chemical composition of which, excluding dopants that may be present, corresponds to the empirical formula:

$$(\text{Fe}_{1-z}M_z)_xO \quad \text{(I)}$$

wherein:
the metals or the oxygen are in the form of ions;
Fe represents identical or different ferrous and/or ferric cations;
M represents metal cations, other than the ferrous cations;
z represents the number of metal cations other than the ferrous cations;
x being a number less than 1 and greater than 0.75; wherein the thin film is a two-phase material comprising the at least one combination of iron monoxide and of spinel ferrite(s), wherein the spinel ferrite(s) are at least a part of a spinel oxide phase and the iron monoxide is at least a part of an NaCl-type oxide phase.

14. The bolometric device as claimed in claim 13, wherein the thin film has the structural formula:

$$\omega\text{Fe}_{3-y}M_yO_4+(1-\omega)(\text{Fe}_{1-v}M_v)_sO \quad \text{(III)}$$

wherein:
$(1-\omega)(\text{Fe}_{1-v}M_v)_sO$ represents an NaCl-type iron monoxide phase;

$\omega Fe_{3-y}M_yO_4$ represents a spinel oxide phase, with:
v representing the number of M cations, other than the ferrous ions, present within the iron monoxide phase;
y representing the number of M cations, other than the ferrous ions, present within the spinel phase;
s being a number strictly less than 1 and strictly greater than 0.75;
ω being a number that fulfills the relationship $0<\omega\leq 1$;
the metals or the oxygen are in the form of ions;
Fe represents identical or different ferrous and/or ferric cations; and
M represents metal cations, other than the ferrous cations.

15. The bolometric device as claimed in claim 13, wherein the thin film has a thickness ranging from 10 to 500 nm.

16. The bolometric device as claimed in claim 13, wherein the at least one sensor, inserted into a housing comprising an infrared-transparent aperture area, comprises a membrane capable of absorbing infrared radiation and of converting it to heat, the membrane being arranged so as to be able to be exposed to incident infrared radiation that has passed through the aperture area, and so as to transmit a portion of the heat thus produced to the sensitive element.

17. The bolometric device as claimed in claim 13, comprising a plurality of the at least one sensor in the form of an array of pixels.

18. The bolometric device as claimed in claim 17, wherein the array is connected to a CCD or CMOS matrix.

19. The bolometric device as claimed in claim 13, wherein the thin film comprises crystallites having a diameter ranging from 5 and 50 nm.

20. A method of detecting infrared radiation or of producing infrared imaging, the method comprising:
absorbing incident radiation with a bolometric device capable of absorbing the incident radiation,
converting the absorbed incident radiation to heat, and
communicating a portion of the heat produced to a sensitive element whose resistivity varies with the temperature, wherein the bolometric device is as defined in claim 13.

21. A method for providing a thin film sensitive material for the bolometric detection of infrared radiation, comprising providing the thin film recited in claim 13.

22. The method as claimed in claim 21, wherein the chemical composition of the thin film sensitive material is defined as follows:

$$\omega Fe_{3-y}M_yO_4+(1-\omega)(Fe_{1-v}M_v)_sO \quad \text{(III)}$$

where:
$(1-\omega)(Fe_{1-v}M_v)_sO$ represents an NaCl-type iron monoxide phase;
$\omega Fe_{3-y}M_yO_4$ represents a spinel oxide phase, with:
v representing the number of M cations, other than the ferrous ions, present within the iron monoxide phase;
y representing the number of M cations, other than the ferrous ions, present within the spinel phase;
s being a number strictly less than 1 and strictly greater than 0.75;
ω being a number that fulfills the relationship $0<\omega<1$;
the metals or the oxygen are in the form of ions;
Fe represents identical or different ferrous and/or ferric cations; and
M represents metal cations, other than the ferrous cations.

23. The method as claimed in claim 22, wherein v satisfies the convention $1-v>v$.

24. The method as claimed in claim 21, wherein the metal cation M is monovalent and chosen from Cu, Li, Na, is divalent and chosen from Co, Ni, Zn, Cu, V, Mg, Mn, or is chosen from rare earths that have an ionic radius compatible with an integration into the spinel structure or into the NaCl-type iron monoxide structure.

* * * * *